United States Patent
Hiraoka et al.

(10) Patent No.: US 6,472,299 B2
(45) Date of Patent: Oct. 29, 2002

(54) METHOD AND APPARATUS FOR TREATING A SUBSTRATE WITH HYDROGEN RADICALS AT A TEMPERATURE OF LESS THAN 40 K

(75) Inventors: Kenzo Hiraoka, Kofu; Chiharu Miyata, Yamanashi; Toshiyuki Takamatsu, Yachiyo, all of (JP)

(73) Assignee: Yamanashi Prefectural Federation of Societies of Commerce and Industry, Yamanashi (JP)

( * ) Notice: Subject to any disclaimer, the term of this patent is extended or adjusted under 35 U.S.C. 154(b) by 0 days.

(21) Appl. No.: 09/811,785

(22) Filed: Mar. 20, 2001

(65) Prior Publication Data

US 2002/0037634 A1 Mar. 28, 2002

(30) Foreign Application Priority Data

Sep. 27, 2000 (JP) ........................................ 2000-294738

(51) Int. Cl.[7] ...................... H01L 21/20; H01L 21/36; C30B 23/00; C23C 16/00; H05H 1/02
(52) U.S. Cl. ...................... 438/509; 117/88; 117/204; 118/723 R; 427/574
(58) Field of Search .................. 427/535, 569–579; 118/723 R, 723 MP, 723 E, 724; 438/478, 509; 117/89, 91, 99, 105, 204

(56) References Cited

U.S. PATENT DOCUMENTS

| | | | | |
|---|---|---|---|---|
| 5,192,849 A | * | 3/1993 | Mosiehi | 156/345.51 |
| 5,264,394 A | * | 11/1993 | Ruckman et al. | 148/DIG. 118 |
| 5,282,903 A | * | 2/1994 | Ruckman et al. | 148/33.3 |
| 5,328,558 A | * | 7/1994 | Kawamara | 156/643 |
| 5,558,736 A | * | 9/1996 | Lee et al. | 118/723 |
| 6,114,032 A | * | 9/2000 | Kelber | 427/509 |
| 6,210,541 B1 | * | 4/2001 | Coorfey et al. | 118/725 |
| 6,306,495 B1 | * | 10/2001 | Kelber | 428/336 |

FOREIGN PATENT DOCUMENTS

| | | | |
|---|---|---|---|
| JP | 61-026772 | | 2/1986 |
| JP | 4-65826 | * | 3/1992 |
| RU | 2100477 C1 | * | 12/1997 |

OTHER PUBLICATIONS

US PG Pub. 2001/0015261 A1 (Kobayashi et al.).*
Hiraoka, et al. "Formation of formaldehyde and methanol from the reactions of H atoms with solid CO at 10–20 K" Chemical Physics Letters 229 (1994), pp. 408–41.*
Hiraoka et al. "Reaction of H atoms with solid C2H4 and C2H6 at 13 K" Astrophysical Journal 514(1), Mar. 1999, pp. 524–528.*
"Energetic–particle–induced reactions in adsorbed phase at cryogenic temperature for material growth and processing" IBM Technical Disclosure Bulletin, IBM Corp. New York, US, vol. 34, No. 5, Oct. 1, 1991, pp. 291–292, XP000189741 ISSN: 0018-8689.
Lenski M et al: "Substrate temperature dependent photo-electrical and structural properties of A–SI:H deposited by hydrogen assisted chemical vapourdeposition" thin solid films, Elsevier–Sequoia S.A. Lausanne, CH, vol. 288, No. 1/2, Nov. 15, 1996 (1996–11–15), pp. 337–345, XP000691307 ISSN: 0040-6090.

* cited by examiner

Primary Examiner—Olik Chaudhuri
Assistant Examiner—Erik Kielin
(74) Attorney, Agent, or Firm—McDermott, Will & Emery (57) ABSTRACT

A substrate M having a thin film on its surface is supported on a support 4. A gas discharge opening 12A of hydrogen radicals which faces the thin film on the substrate is provided. A semiconductor thin film is deposited on the substrate M by supplying the thin film with hydrogen radicals H from the gas discharge opening 12A while the substrate M is cooled via to 40 K or less through heat conduction via the support 4 by means of refrigerator 3.

6 Claims, 8 Drawing Sheets

METHOD AND APPARATUS FOR TREATING A SUBSTRATE WITH HYDROGEN RADICALS AT A TEMPERATURE OF LESS THAN 40 K

BACKGROUND OF THE INVENTION

1. Field of the Invention

The present invention relates to a process and apparatus for manufacturing a semiconductor thin film such as silicon thin film.

2. Description of Related Art

In a process for manufacturing a semiconductor, a technology for forming semiconductor thin films is an important factor since the formed thin films constitute a semiconductor device structure so that they give a great influence upon the characteristics, yield and reliability of the device.

The thin film forming technology is mainly classified into CVD (chemical vapor deposition), PVD (plasma vapor deposition), applying and coating process and plating process. The former CVD and PVD are mainly used. CVD and PVD processes are classified into various many processes.

For example, vacuum deposition, plasma CVD, evacuated or normal pressure CVD, reactive sputtering, ion plating, optical CVD processes are conducted for forming amorphous silicon films. Plasma CVD process is mainly used for this purpose.

The largest problem resides in that it is difficult for prior art to form uniform thin films having a large area. Since the uniformity of the film tissue structure and film thickness is related with various manufacturing factors. It is very difficult to control them.

SUMMARY OF THE INVENTION

Therefore, it is an object of the present invention to form a semiconductor thin film which is excellent in uniformity of the film tissue structure and the film thickness by supplying a substrate having a thin film formed on the surface thereof with hydrogen radicals to effect the tunnel reaction while the substrate is cooled to temperatures below 40 K.

The present invention provides a process for forming a semiconductor thin film on the surface of a substrate by supplying said substrate with hydrogen radicals under cryogenic condition below 40 K, preferably below 20 K, more preferably 10 K.

When the substrate having a thin film on the surface thereof is cooled, heat is removed from the support which supports the substrate through heat conduction via a cooling head of a refrigerator.

In this case, a hydrogen radical gas discharge opening is provided so that it faces the thin film on the substrate. It is preferable to uniformly supply hydrogen radicals to the thin film surface from the hydrogen radical gas discharge opening.

The semiconductor thin film formed on the substrate may have lattice defects. The lattice defects can be repaired by conducting an annealing treatment. In this case, it is preferable to heat the substrate having the thin film formed thereon through heat conduction via the support so that the temperature of the substrate is elevated to temperatures above room temperature. Stabilization of the thin film can be achieved by supplying said thin film with hydrogen radicals at high temperatures.

Although annealing can be conducted in a separate chamber different from a thin film forming chamber, it is preferable to continue the supply of the hydrogen radicals in the course of heating substrate from the cryogenic temperatures such as 40 K to high temperatures above room temperature in the same chamber in order to prevent the introduction of foreign materials and to enhance the annealing effect.

In one aspect of the present invention, there is provided an apparatus for forming a semiconductor thin film, comprising a vacuum chamber, a refrigerator having a cooling head, hydrogen radical generating means, a support for supporting a substrate which is in contact with said cooling head, hydrogen radical generating means for generating hydrogen radicals by exciting a hydrogen-containing gas and a hydrogen radical gas discharge opening which is disposed opposite to said substrate for spraying a hydrogen-containing gas which contains hydrogen radicals generated from said hydrogen radical generating means upon said thin film.

In another aspect of the present invention, there is also provided an apparatus for forming a semiconductor thin film, comprising a vacuum chamber, a refrigerator having a cooling head, which is capable of cooling the head to temperatures below 40 K, hydrogen radical generating means, a support for supporting a substrate which is in contact with said cooling head so that it is cooled, heating means for heating said support to temperatures above room temperature, hydrogen radical generating means for generating hydrogen radicals by exciting a hydrogen-containing gas and a hydrogen radical gas discharge opening which is disposed opposite to said substrate for spraying a hydrogen-containing gas which contains hydrogen radicals generated from said hydrogen radical generating means upon said thin film.

MODE OF EMBODYING THE INVENTION

The mode of embodying the present invention will now be described in detail.

Figure 1:
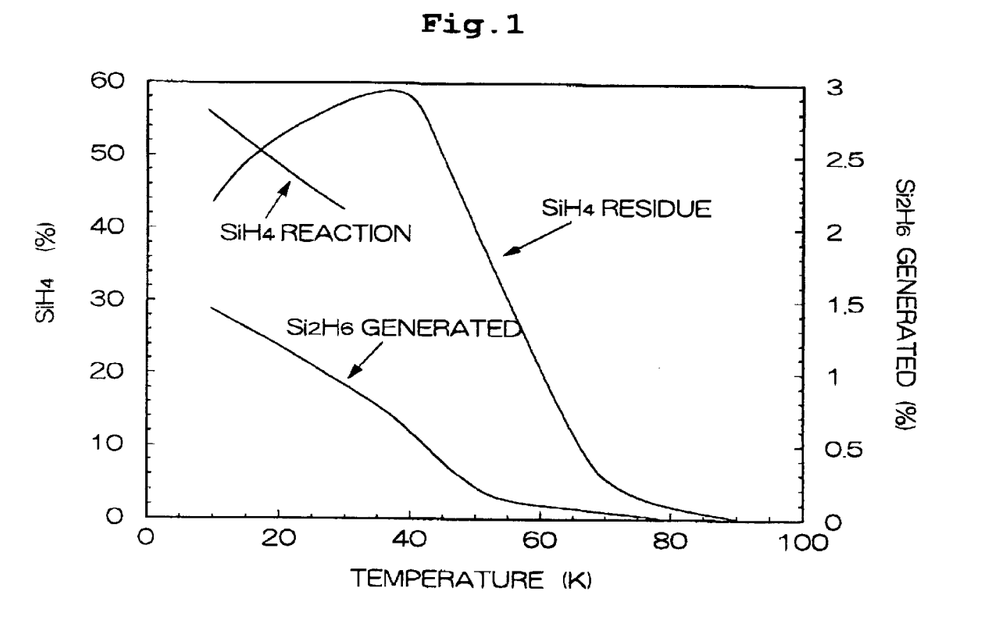
FIG. 1 is a graph showing an experiment result.

After a thin film of monosilane ($SiH_4$) having a 12 molecule layer which was vacuum deposited on a silicon substrate at cryogenic temperatures in a vacuum chamber is irradiated with hydrogen radicals for one hour, the reactions between the thin film and the hydrogen radicals were observed by high sensitive reflection infrared absorption spectrum measurement for studying the reaction temperature dependency of the reacted $SiH_4$ (and the residual amount) and the generated disilane ($Si_2H_6$). A measurement result which is shown in FIG. 1 is obtained. About 57% of $SiH_4$ disappeared and about 1.5% of $Si_2H_6$ was generated at 10 K. It is considered from this that about 55% of the reacted $SiH_4$ was polymerized. The amount of $SiH_4$ which is reacted and that of $Si_2H_6$ which is generated as the temperature is elevated decreases in the range of the temperatures from 10 K to 40 K at which $SiH_4$ begins to dissociate.

It is found from this that the reactivity between hydrogen atoms and the silicon thin film is higher at the lower temperatures. It is deemed that this is due to the fact that the hydrogen atoms exhibit a peculiar chemical reactivity while effecting quantum mechanical tunnel reactions at cryogenic temperatures. The hydrogen atoms have the smallest mass of all atoms. Accordingly, the hydrogen atoms have the highest quantum characteristics, so that they exhibit a remarkable wave characteristics. The hydrogen atoms exhibit tunnel reactions at cryogenic temperatures due to the remarkable wave characteristics. The reaction velocity at cryogenic temperatures is equal to or higher than that at normal temperatures. Accordingly, it is possible to form silicon thin films at a high reaction velocity at cryogenic temperatures.

An embodiment of the present invention will be described in detail with reference to FIG. 2.

A chamber 1 is evacuated by means of a vacuum pump 2. A refrigerator 3 includes a cooling head 3A. A radiating shield 3B is provided in the outer periphery of the cooling head 3A. A space between the cooling head 3A and the radiating shield 3B is evacuated and the radiating heat is prevented from conducting into the cooling head 3A from the outer periphery by the radiating shield 3B. The cooling head 3A can be cooled to a temperature below 40 K by the main body of the refrigerator 3. A support 4 which supports a substrate M is secured to the cooling head 3A, so that the cold condition of the cooling head 3 is conducted to the substrate M, so that the substrate M is cooled. Heating means 5 such as ceramic heater which is in contact with the support 4 is provided, so that heat is conducted to the substrate via the support 4.

On the other hand, hydrogen radical generating means 10 which generates hydrogen radicals by exiting a hydrogen-containing gas G is provided. The hydrogen radical generating means 10 comprises, for example, a microwave plasma generating apparatus. A molybdenum wire 10A is used as a trap. The hydrogen-containing gas which contains hydrogen radicals generated by the hydrogen radical generating means 10 is introduced via a conduit 11 to a gas shower 12 disposed in the vacuum chamber 1. The gas shower 12 is provided with a multiplicity of gas discharge openings 12A, each comprising a pore having a diameter of about 0.1 mm. The thin film on the substrate M is irradiated with the hydrogen-containing gas which contains hydrogen radicals H.

A discharge opening 13 and an opening 14 through which the substrate M is loaded or unloaded are provided with gate valves 15. A cooling shroud 16 is adapted to distribute, for example, liquid nitrogen to keep cooling of the substrate M.

A thin film is formed on the surface of the substrate M by, for example, vacuum deposition. In order to conduct this vacuum deposition, the vacuum chamber 1 is used as it is, or alternatively, a substrate having a vacuum deposited thin film may be loaded into the vacuum chamber 1. In either case, the substrate M having a thin film thereon is placed upon the support 4. A substrate M which has been introduced into a load lock chamber (not shown) may be loaded into the vacuum chamber 1 and placed upon the support 4 in the vacuum chamber 1 by using a robot.

Subsequently, the cooling head 3A is cooled by means of the refrigerator 3 so that the substrate M is cooled to temperatures below 40 K by the heat conduction via the support 4. At this time, the hydrogen-containing gas which contains hydrogen radicals generated by the hydrogen radicals generating means 10 is introduced via the conduit 11 to the gas shower 12 disposed in the vacuum chamber 1 so that the hydrogen-containing gas is sprayed over the thin film on the substrate M from each of the gas discharge openings 12A. A semiconductor thin film is formed on the substrate M by conducting this operation for a predetermined period of time.

The substrate M having the semiconductor thin film formed thereon may be unloaded from the vacuum chamber 1 and may be subjected to annealing. It is preferable to anneal the thin film in the same vacuum chamber 1 subsequently of the formation the semiconductor thin film. In other words, the operation of the refrigerator 3 is terminated. The substrate M having the semiconductor thin film thereon is heated to temperatures higher than the room temperature, for example 100 to 600° C. through the heat conduction via by means of heating means 5 such as ceramic heater to achieve annealing while supply of the semiconductor thin film with hydrogen radicals H is continued.

The semiconductor thin film which is synthesized at low temperatures may have lattice defects. Such defects can be repaired by heating the synthesized thin film above the room temperature and treating the film with hydrogen atoms, so that homogenization of the film quality can be achieved. In other words, the lattice defects can be repaired by the above-mentioned annealing process to remove the hydrogen atoms in Si—H bonds existing in a solid material in which hydrogen atoms are diffused over a wide range in a silicon crystal.

When the thin film is formed on the substrate by vacuum deposition in the foregoing embodiment, the vacuum deposition may be achieved under highly low pressure vacuum condition by using silane gas as well as raw material gas such as germane, special gas for manufacturing semiconductor, organic metal compound gas. It is possible to form ultra-lattice thin films by vacuum deposit germane, organic metal compound and the like and reacting them with hydrogen atoms. For example, formation of ultra-lattice thin films formed of ZnS and ZnSe or formation of silicon, germane films for solar batteries is possible.

The hydrogen radical generating means 10 may produce hydrogen radicals by irradiation of the gas with discharge plasma (d.c. discharge or microwave, radio frequency discharge, RF discharge), electron beam or catalytic thermal cracking with a metal. The hydrogen atoms (hydrogen radicals) from the hydrogen radical generating means 10 is sprayed over the thin film which has been or is being deposited upon the substrate. The gas from which the hydrogen atoms are generated may be pure hydrogen gas or a mixed air of hydrogen gas and rare gas (helium or neon gas). Hydrogen atoms (or methyl groups and the like) are removed from gas molecules for manufacturing semiconductor by the tunnel reactions between the semiconductor molecules which constitute the thin film and the hydrogen atoms for decomposing the molecules of sample gas. The decomposed molecules react with each other to form a thin film of a semiconductor.

The process for manufacturing a thin film of a semiconductor may comprise the steps of vacuum depositing a thin film having a predetermined film thickness and spraying hydrogen atoms thereon. Alternatively, it may comprise spraying hydrogen atoms simultaneously with continuously depositing a semiconductor manufacturing specimen gas.

In order to increase the denseness of the formed thin film, the thin film which is being formed is irradiated with helium or neon atoms which are produced with ultraviolet rays or discharging plasma having electrons excited at a quasi-stable level, on reaction at 10 K. This allows high quality thin film having less void to be formed.

Since the thin film which has been synthesized at cryogenic temperatures has insufficient network between atoms as mentioned above, it may require annealing for modification to provide a high quality semiconductor. On annealing, the thin film may be irradiated with hydrogen atoms, as well as quasi-stably excited atoms or ultraviolet rays while the temperature of the substrate on which the thin film is formed is continuously elevated from a temperature below 10 K to high temperatures exceeding the room temperature. This promotes the formation of the network of the atoms, which constitutes the thin film, so that a high quality semiconductor, metal, oxide or nitride film is formed.

The cryogenic thin film manufacturing technology of the present invention may be applied to the forming of semiconductor, metal, oxide, nitride thin films. Since the thickness of the formed film accurately corresponds to that of the film deposited on the cryogenic substrate, the thin film is irradiated with oxygen or nitrogen atoms for manufacturing the oxide or nitride thin film. This makes it possible to form various thin films which have uniform quality and large area.

EXAMPLE 1

Figure 2:
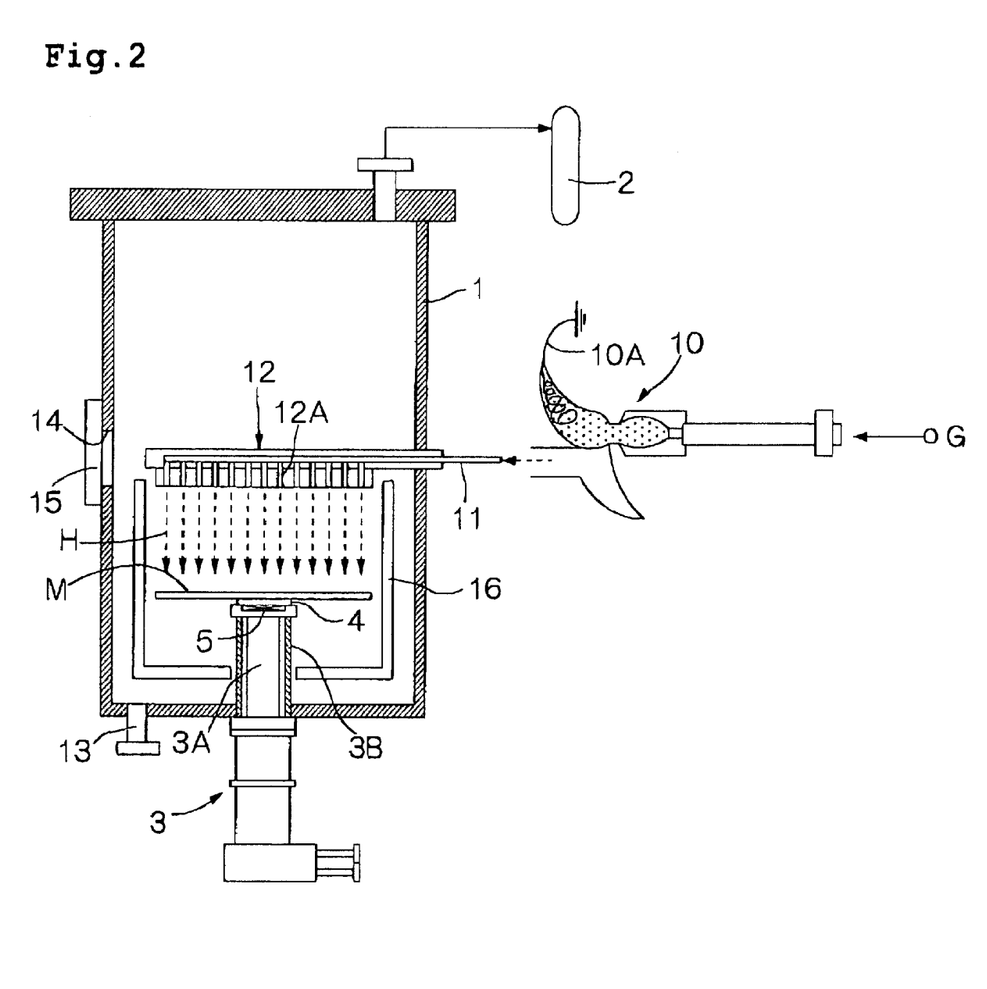
FIG. 2 is a schematic diagram showing the manner of forming a thin film in accordance with the present invention.

When the monosilane ($SiH_4$) thin film having a molecule layer which is vacuum deposited upon the silicon substrate as mentioned above is irradiated with hydrogen radicals at 10 K in the apparatus shown in FIG. 2, disilane ($Si_2H_6$) can be produced at 1.5%.

EXAMPLE 2

It has been confirmed that various semiconductor thin films of materials other than silane can be effectively formed at temperatures below 40 K.

From the foregoing, we obtained following finding. The silicon network structure may be in the form of amorphous or polycrystal. Thin films having a high quality, stability and band gap which is controlled over a wide range between 1.5 eV to 2.0 eV can be obtained as a result of the surface structure control for amorphous silicon using hydrogen atoms. A drastic improvement in the structure stability can be expected in comparison with prior art amorphous silicon film. When polycrystal silicon is used. High quality and stable polycrystal silicon thin film structure having a crystallization factor of 90% or more and a particle size of 200 nm to 300 nm can be obtained. A silane halide such as SiF, SiCl H, $SiH_4$ Cl is used as a raw material. When such a raw material is decomposed with plasma in the presence of hydrogen atoms, polycrystal thin film is formed at low temperatures at a rate of 0.1 nm/s to 2 nm/s. Polycrystal having different microstructure of crystal grains can be controlled with a high reproducibility by adjusting the amount of the hydrogen atoms to be supplied. Polycrystal silicon thin films having, for example, (220) and (400) preferred orientations, respectively can be produced. Photon containment effect of solar batteries can be expected for the former thin film due to irregularity on the surface thereof, so that the film can be applied as the material of next generation thin film solar batteries. Since the latter film has a surface which is smooth at an atomic scale, it can be applied as thin film transistors for driving liquid crystal displays. Since the defects in both types of this films can be repaired with hydrogen, they exhibit excellent photoconductivity and relatively high carrier mobility (10 to 20 cm/Vs).

EXAMPLE 3

Fundamental findings of the inventors was based upon the following experiments.

The general experimental procedures were similar to those described previously. The cryocooler (Iwatani Plantech, type D310) and a quadrupole mass spectrometer (Leda Mass, Microvision 300D) were housed in a vacuum manifold. The vacuum chamber as evacuated by two turbomolecular pumps (ULVAC, UTM-500, 500L/s and Seiko Seiki, STP-H200L/s) connected in tandem. The base pressure of the vacuum system under the current experimental conditions was $\sim 5 \times 10^{-10}$ Torr after baking the vacuum system. The sample gas $SiH_4$ was deposited on the silicon substrate ([100] surface with the size of 30×50×0.5 mm) which was firmly pressed to the cold head of the cryocooler using indium foil between the mating surfaces. The sample gas $SiH_4$ was introduced through the calibrated stainless steel capillary (internal diameter of 0.1 mm and 1 m long) onto the cooled silicon substrate in the vacuum chamber. During the gas deposition at 10 K, only a slight increase of the base pressure of the vacuum chamber was observed ($5 \times 10^{-10} \rightarrow 4 \times 10^{-9}$ Torr). This indicates that almost all of the gas samples introduced were deposited on the silicon substrate. After the deposition of the sample, H atoms produced by the DC discharge of $H_2$ gas were sprayed over the sample film. The sample film was completely prevented from being bombarded by the charged particles and UV photons produced by the plasma. The discharge tube which was held by the copper sleeve connected to the cold head was kept at ~27 K when the cold head was cooled down to 10 K. It is known that the temperature of ions and molecules in the low-temperature glow plasma is nearly the same as that of the wall of the discharge tube. Thus, the temperature of H atoms sprayed over the sample film may be about 27 K. It was confirmed that the local heating and resultant desorption of molecules from the surface of the solid film were negligible when the H-atom-containing $H_2$ gas was sprayed over the sample.

The real-time and in situ observation of the solid-phase reactions was made by the spectroscopic ellipsometry (SE) and Fourier transform-infrared (FT-IR) spectroscopy. The SE analysis was performed using a rotating-compensator instrument (J. A. Woolam, M-2000) that enables the measurement of ellipsometry parameters in the full range ($\Delta=0-360°$, $\Psi=0-90°$). Infrared spectra of products formed from the reaction of H atoms with deposited samples were measured using an FT-IR spectrometer (Nicolet, Magna-IR 760) with a resolution of 4 $cm^{-1}$ in combination with a KBr beam splitter and a liquid $N_2$-cooled MCT (HgCdTe) detector. The quantitative analysis of the products was performed by means of the thermal desorption mass spectrometry.

The measurement of the flux of H atoms sprayed over the solid film was not made in the present experiment. In the ordinary glow discharge plasma, a few percent of reagent gas is decomposed into atoms. In the present experiment, the discharged $H_2$ gas flowed through a restricted narrow bottleneck (0.2 mm internal diameter and about 2 mm long) and then passed through a 90° bent glass tubing with a 6 mm diameter and about 5 cm long before being sprayed over the solid film. From the flow rate of the $H_2$ reagent gas and the estimated diffusion rate constant of H atoms ($\geq 100$ s$^{-1}$),[14] the H-atom flux over the solid film may be crudely estimated to be $10^{13}$~$10^{14}$ atoms cm$^{-2}$s$^{-1}$ under the present experimental conditions.

Results and Discussion

[In situ and real-time observation of products formed from reactions of H atoms with solid SiH$_4$ film by means of FT-IB spectroscopy and spectroscopic ellipsometry]

Figure 3:
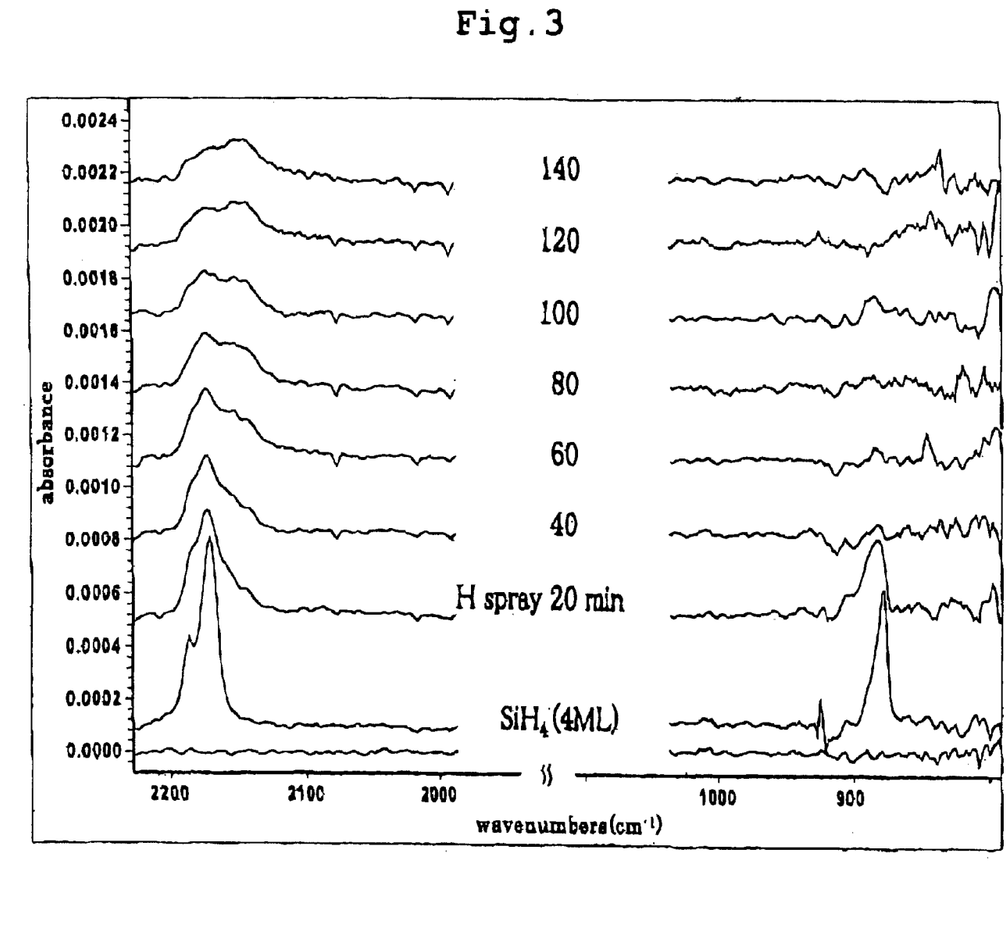
FIG. 3 shows FT-IR spectra for a 4 monolayers (ML) thick SiH4 sample film sprayed by H atoms.

The inventors have found that the thermal desorption mass spectrometry is effective in the analysis of the product. This method is very sensitive and highly suitable for such experiment that the quantity of the reactants and products are only limited to be as low as a few monolayer (ML) thick deposited film. Strictly speaking, however, there is no guarantee that the products detected by the thermal desorption method are formed at the reaction temperature but not during the warming up of the sample for thermal desorption analysis. In order to perform in situ and real-time product analyses in the low-temperature solid-phase reactions, infrared absorption spectra of SiH$_4$ film being reacted with H atoms were measured. FIG. 3 shows the FT-IR spectra for a 4 ML thick SiH$_4$ sample film sprayed by H atoms. The bottom spectrum is that for silicon substrate before the sample deposition. The second bottom spectrum corresponds to that for the 4 ML thick SiH$_4$ before reaction. The spectra from the bottom to the top were measured with a time interval of 20 minutes.

In FIG. 3, the absorption due to stretching vibrations of v1 (2187 cm$^{-1}$) and v$_3$ (2191 cm$^{-1}$) of SiH$_4$ decreases and new broad absorption bands with lower wavenumbers grow at the expense of those with higher wavenumbers with reaction time. This clearly indicates the formation of Si—Si bond linkage in the solid film. The deformation vibration absorption band of v2 (–907 cm$^{-1}$) and v4 (–890 cm$^{-1}$) almost completely disappeared with reaction time of about 40 min. This indicates that a greater part of the SiH$_4$ molecules in the 4 ML film suffered from the H-atom abstraction by the reaction of H atoms in 40 min.

The formation of a thin solid product on the silicon substrate was confirmed when the silicon substrate was taken out from the vacuum system. Analysis of the solid product was made by SE. The thin solid product formed from the reaction of H with solid SiH$_4$ at 10 K was found to be converted gradually to SiO$_2$ when it was exposed to the ambient air. This suggests that the solid product may have the polysilane-like network structure (see FIG. 3). The polysilane (Si$_n$H$_{2n+2}$) is known to be readily oxidized to SiO$_2$ in the ambient atmosphere. It was found that the oxidation reaction was largely suppressed when the solid product formed at 10 K was further reacted by H atoms at 200 K for about I hour. With increase of temperature from 10 K to 200 K, the unreacted residual SiH$_4$ molecules in the solid film desorbed and only the involatile solid product was left on the silicon substrate. Such a "chemical annealing" (i.e., the H-atom spray at higher temperature) of the solid product apparently enhances the growth of the Si—Si bond network by the H atom abstraction reaction from the polysilane-like network. The chemically annealed solid product at 200 K was found to be stable and did not show any structural change when it was left in the ambient atmosphere.

Figure 4:
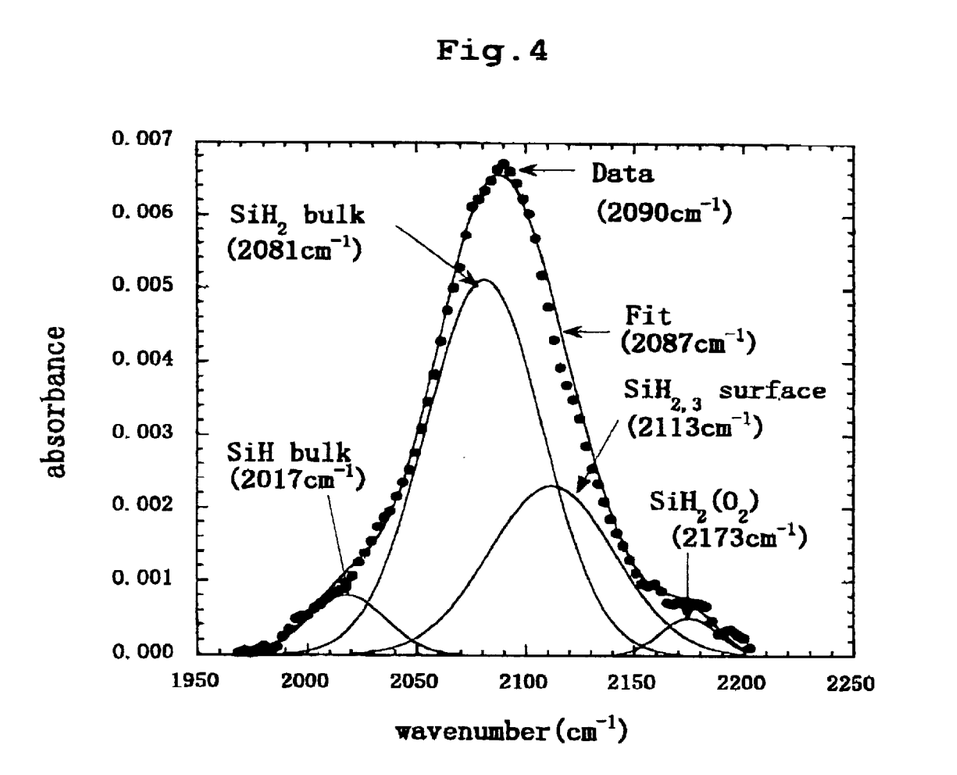
FIG. 4 shows FT-IR spectrum of the solid product which has formed at 10 K and then further reacted with H atoms at 200 K for 1 hour.

FIG. 4 shows the FT-IR spectrum of the chemically annealed solid product (formed at 10 K and annealed at 200 K). This spectrum was measured ex situ because the reference spectrum for, the silicon substrate was necessary for the measurement. The absorption peak is unsymmetrical and is broader in the lower wavenumbers. The deconvoluted absorption spectrum assuming Gaussian function is found to be quite similar to that for the a-Si:H film obtained by the conventional radio-frequency plasma-enhanced chemical vapor deposition.[15] A shoulder peak appearing at –2017 cm$^{-1}$, the strong peak at –2081 cm$^{-1}$, the broad higher-wavenumber peak at –2113 cm$^{-1}$, and a weak peak at –2173 cm$^{-1}$ may be assigned to the absorptions of the bulk Si—H stretching vibration, the bulk SiH$_2$ stretching vibration, the surface SiH$_{2,3}$ vibration, and SiH$_2$(O$_2$) vibration, respectively.[15] It is likely that the polysilane network, i.e., —(SiH$_2$)n—, formed at 10 K is largely converted to the three-dimensional Si—Si bond network by the chemical annealing at 200 K.

Figure 5:
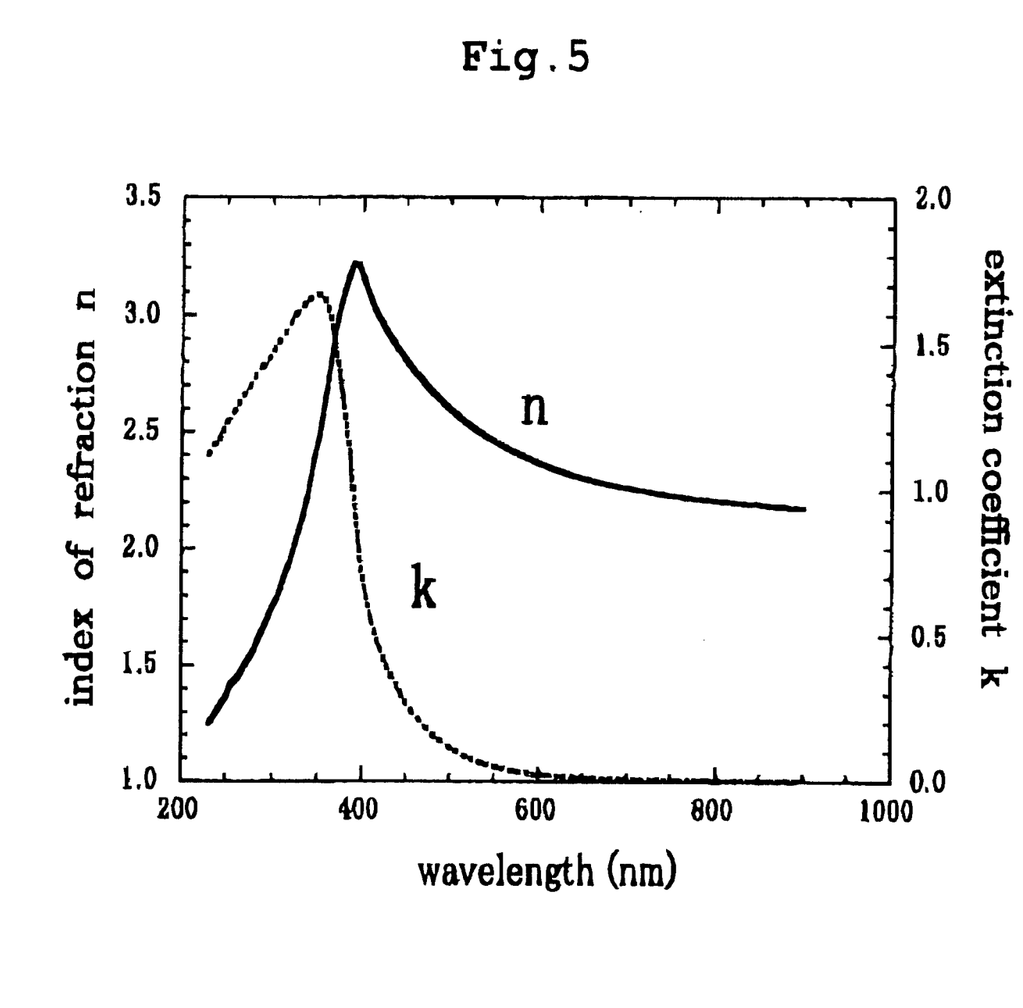
FIG. 5 shows the index of refraction (n) and extinction coefficient (k) measured by the spectroscopic ellipsometry for the same sample in FIG. 4.

FIG. 5 represents the index of refraction (n) and the extinction coefficient (k) as a function of wavelength (nm) measured by SE. The spectral features for n and k are found to be the combination of those for amorphous and crystalline silicon, being amorphous silicon rich.16 The a-Si:H synthesized by the conventional plasma CVD has the n value of about 4.5 at –400 nm. The n value of 3.2 at –400 nm in FIG. 3 does not necessarily mean that the solid product obtained in the present experiment contains lots of voids in the film because the surface roughness was not taken into consideration in the present SE analysis. A more detailed SE analysis is now in progress in our laboratory.

[Relationship between H-atom spray time and the yield of reaction products]

Figure 6:
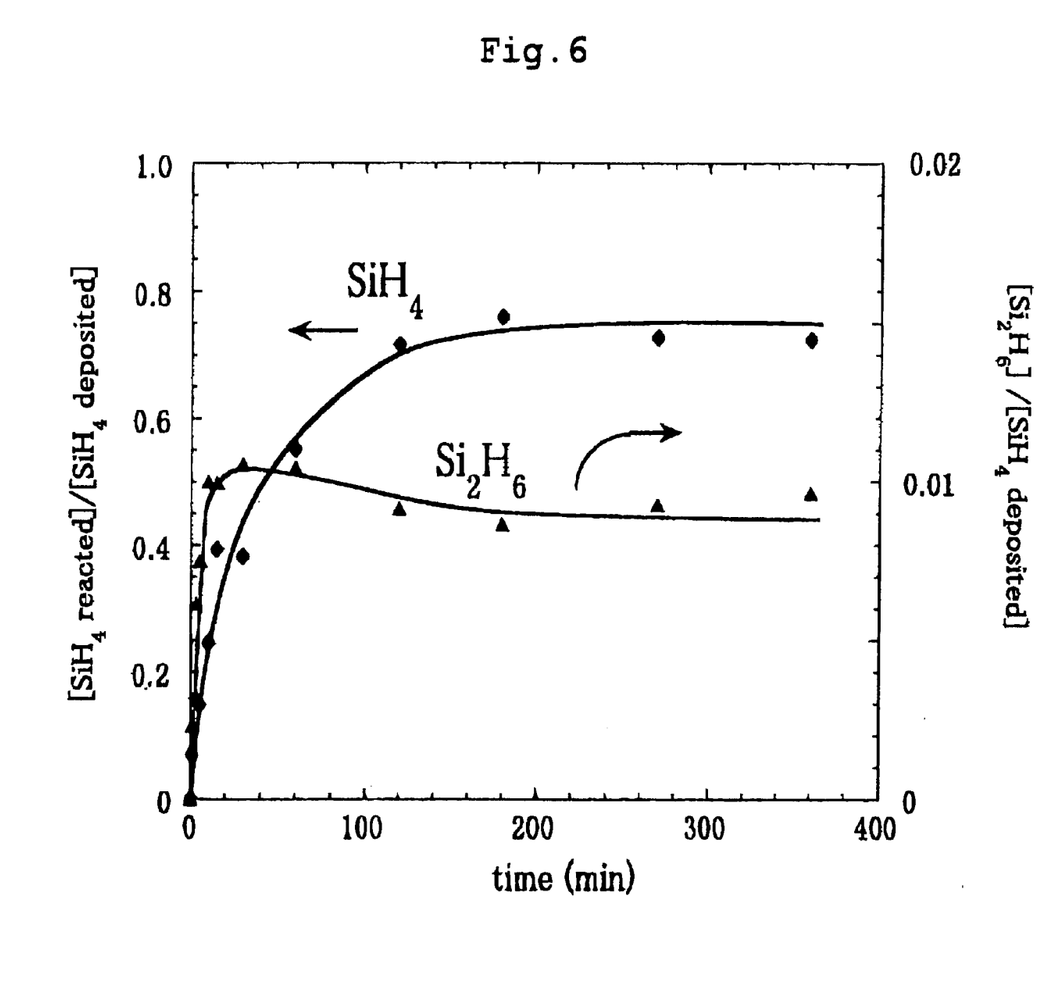
FIG. 6 shows the dependence of H-atom spray time on the ratio [$SiH_4$ reacted/$SiH_4$ deposited] and the yield of $Si_2H_6$.

FIG. 6 shows the dependence of the time of H atom spray on the ratio of [SiH$_4$ reacted]/[SiH$_4$ deposited] and the yield of Si$_2$H$_6$ for 12 ML SiH$_4$ film reacted with H atoms at 10 K. Here, the "yield" means the ratio of the amount of the product to the deposited SiH$_4$. The reaction temperature was kept at 10 K all through the experiment. Only Si$_2$H$_6$ but no other Si$_n$H$_{2n+2}$ with $n \geq 2$ could be detected as gaseous products by thermal desorption mass spectrometry. In FIG. 4, the yield of Si$_2$H$_6$ increases very steeply to the maximum (0.01) and becomes nearly time-independent after 30 min. The ratio [SiH$_4$ reacted]/[SiH$_4$ deposited] increases more gradually than the yield of Si$_2$H$_6$ and reaches the plateau (0.7) with reaction time of –120 min. Because no gaseous products other than Si$_2$H$_6$ were detected, the greater part of the reacted SiH$_4$ is likely to be converted to the solid product. The more rapid increase of Si$_2$H$_6$ than the solid product (i.e. [SiH$_4$ reacted]/[SiH$_4$ deposited]) suggests that Si$_2$H$_6$ is the intermediate product (i.e., precursor) for the formation of the solid product. The fact that the value of [SiH$_4$ reacted]/[SiH$_4$ deposited] and the yield of Si$_2$H$_6$ do not show the steady increase but become time-independent with reaction time after –120 min suggests that the steady states were established for the formation and destruction of Si$_2$H$_6$ and also the solid product. In other words, the H atom must act not only as an activator for the formation of the Si—Si bond network, but also as an etchant for the formed solid product at 10 K.

The possible mechanism for the formation of polysilane (Si$_2$H$_{2n+2}$) and amorphous silicon may be summarized as follows:

$$SiH_4 + H = SiH_3 + H_2 \quad (-50) \tag{3}$$

$$SiH_3 + H = SiH_2 + H_2 \quad (-132) \tag{4}$$

$$SiH_2 + SiH_4 = Si_2H_6 \quad (-244) \tag{5}$$

$$SiH + SiH = Si_nH_{2n+2} \tag{6}$$

Further reactions of H-atoms with SinH$_{2n+2}$ → . . . →amorphous silicon (7)

The number in parenthesis represents the heat of reaction in kJ/mole[17] (negative, exothermic). The ground state of $SiH_2$ is singlet ($X^1A_1$) and is known to be chemically very reactive. 18 It inserts to the Si—H bond of $SiH_4$ to form the vibrationally excited $Si_2H_6^*$. Because the "hot" $Si_2H_6^*$ is surrounded by the neighboring molecules in the solid phase reactions, the surrounding molecules as a whole may act as an efficient heat bath to quench the "hot" $Si_2H_6$ to the stable $Si_2H_6$ Because $SiH_3$ is unreactive toward $SiH_4$,' the $SiH_3$ radical may be left intact until it further reacts with H to give $SiH_2$ by reaction (4) or to generate $SiH_4$ by the recombination reaction (8).

$$SiH_3 + H = SiH_4 \; (-386) \tag{8}$$

Although the branching ratio of reactions (4) and (8) could not be determined in the present experiment, the steep increase in $Si_2H_6$ with time in FIG. 4 indicates that reaction (4) takes place fast enough to produce $Si_2H_6$.

[Film thickness dependence on the yields of reaction products]

Figure 7:
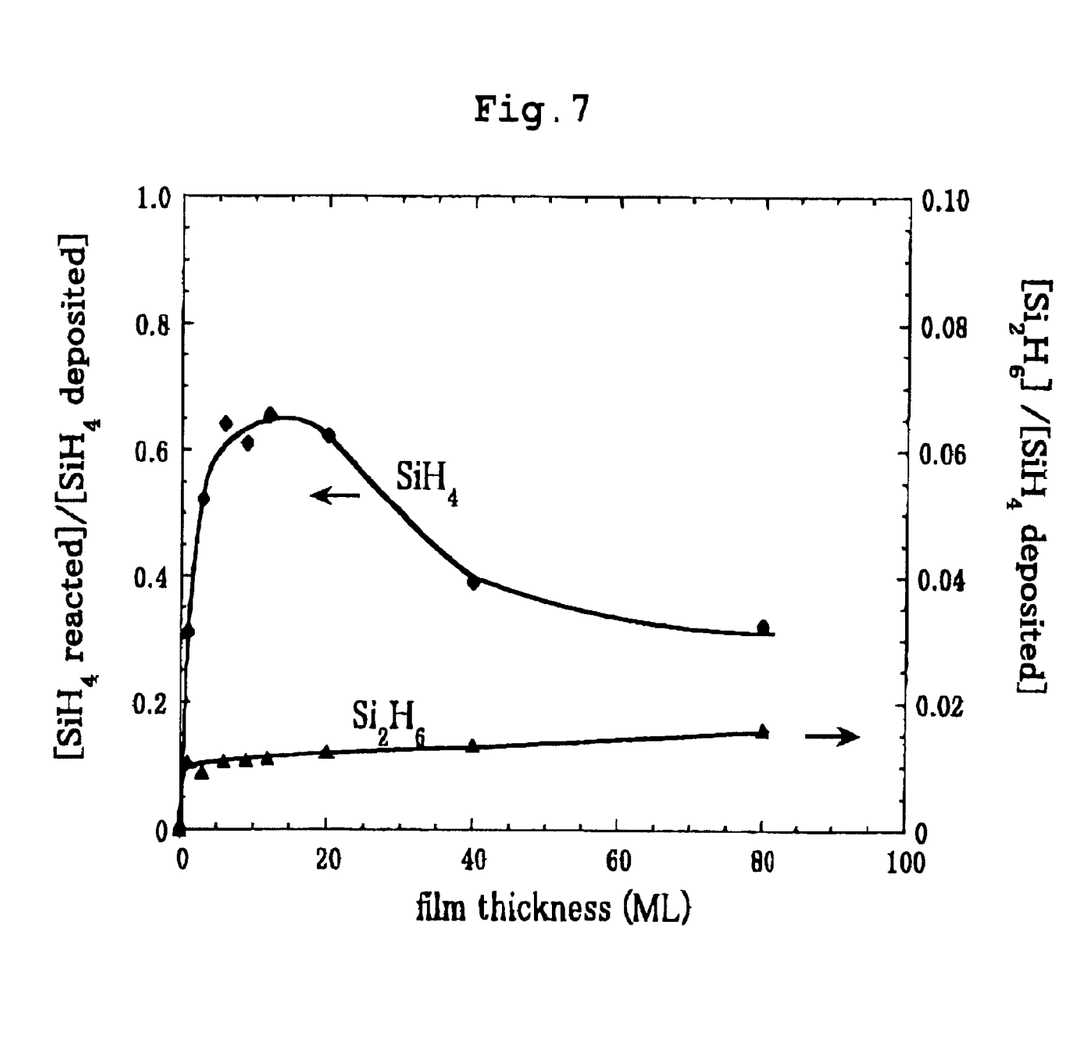
FIG. 7 shows the dependence of sample $SiH_4$ film thickness on the ratio [$SiH_4$ reacted/$SiH_4$ deposited] and the yield of $Si_2H_6$.

FIG. 7 shows the film thickness dependence on the ratio of [$SiH_4$ reacted]/[$SiH_4$ deposited] and the yield of $Si_2H_6$. The $SiH_4$ film deposited was reacted with H atoms for I hour at 10 K. As mentioned in the previous section, the ratio [$SiH_4$ reacted]/[$SiH_4$ deposited] may be regarded as the yield of solid product formed by the reaction. It should be pointed out that the ratio [$SiH_4$ reacted]/[$SiH_4$ despoited] increase very steeply with increase of the film thickness from 0 to 5 ML. It reaches the plateau in the range of 10–20 ML and decreases gradually with film thickness. The initial rapid growth of the yield of the solid product from 0 to 10 ML is reasonable because the presence of the neighboring $SiH_4$ molecules is indispensable for the development of the Si—Si bond network (reactions (3)–(7)). In the range of 10–20 ML, about 70% of the deposited $SiH_4$ molecules are converted to the solid product. The gradual decrease in the yield of the solid product with >20 ML may be due to the less efficient H atom penetration into the film. In other words, the H atom is likely to diffuse rather freely in the $SiH_4$ film thinner than 20 ML.

Because H atoms are sprayed over the solid sample surface, the solid product formation must proceed from the top surface to the inside of the film7 and the $SiH_4$ molecules located in the deeper region have less chance to be incorporated to the Si—Si bond network. Thus, the H-atom treated film might have some inhomogeneous morphology from the top to the bottom. The thinner the sample $SiH_4$ film, the more homogeneous solid product would be formed.

The yield of $Si_2H_6$ shows a sudden increase with film thickness and reaches the plateau (0.01) already with a few ML film thickness. Because the solid product formation proceeds from the surface to inside, the intermediate product $Si_2H_6$ may be mainly formed at the interfacial region between the top-layer solid product and the unreacted underneath $SiH_4$ layer. The nearly film-thickness independent yield of $Si_2H_6$ with—a few ML in FIG. 5 suggests that the interfacial region between the solid product layer and the unreacted $SiH_4$ film layer is thin in molecular level and there may a distinct boundary interface between the two phases.

[Temperature Dependence on the Yields of Reaction Products]

Figure 8:
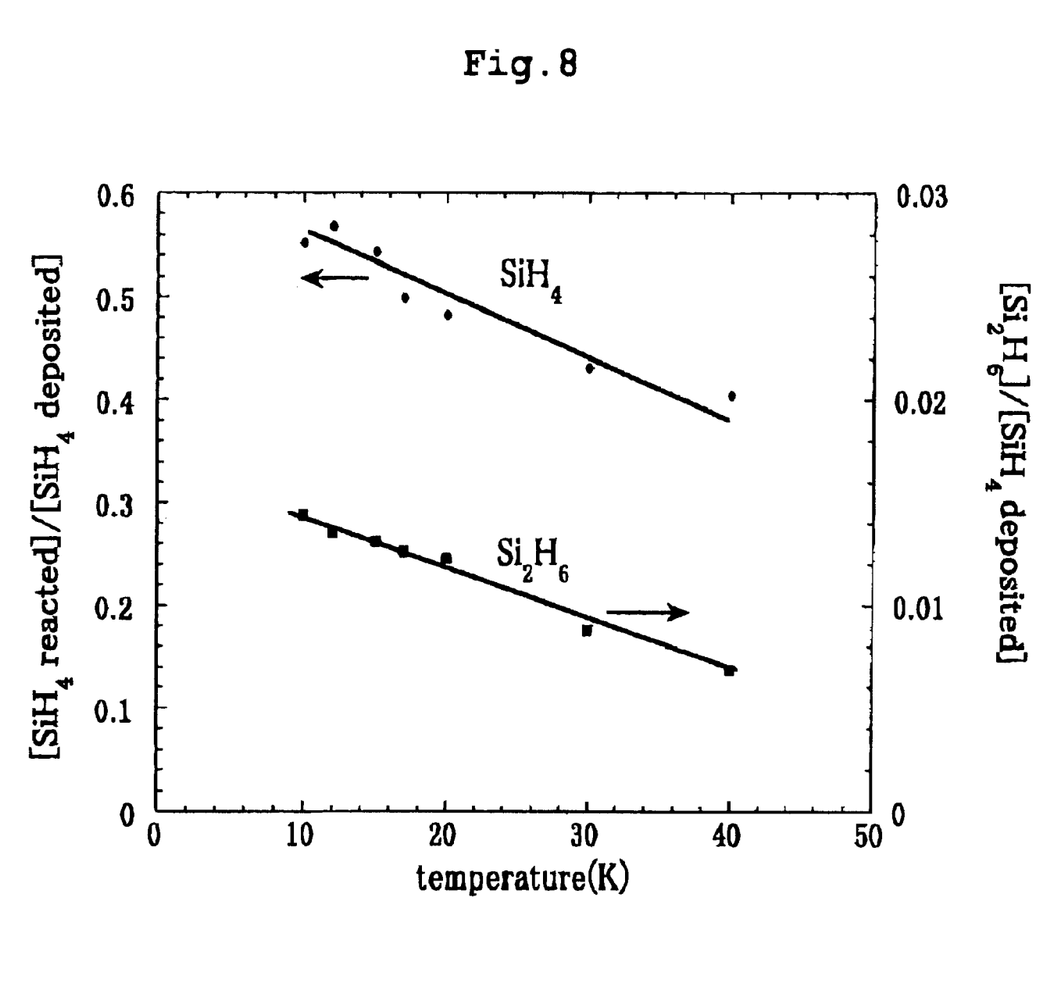
FIG. 8 shows the dependence of reaction temperature on the ratio [$SiH_4$ reacted/$SiH_4$ deposited] and the yield of $Si_2H_6$.

FIG. 8 displays the ratio [$SiH_4$ reacted]/[$SiH_4$ deposited] and the yield of $Si_2H_6$ as a function of reaction temperature. In this experiment, the 12 ML thick $Si_2H_6$ was deposited first at 10 K on the silicon substrate. After the temperature of the silicon substrate was raised to the reaction temperature the deposited film was reacted with H atoms for I hr. Because the deposited $SiH_4$ starts to desorb at about 50 K, the measurement higher than 50 K was not made. In the figure, both the ratio [$SiH_4$ reacted]/[$SiH_4$ deposited] and the yield of $Si_2H_6$ decrease with increase of temperature. Such a negative temperature dependence for the rates of the tunneling reactions has been observed as a general trend in our recent work.7,8 It was suggested that the observed negative temperature dependence may be due either to the increase of the steady state concentration of H atoms on the solid film and/or to the increase of the rate constants for the tunneling reactions with decrease of the reaction temperature.

In any case, the observed negative temperature dependence of the rates for low-temperature tunneling reactions is unique and an unprecedented result. Theoretically, however, the negative temperature dependence of the rate constants for tunneling reactions has been predicted.

[Concluding Remarks]

The low temperature tunneling reactions of H atoms with solid $SiH_4$ were investigated. When the H atoms were sprayed over the solid $SiH_4$ film at 10 K, the abstraction reactions of H atoms of $SiH_4$ by H atoms took place leading to the formation of solid product. The highest yield (70%) was obtained for the sample $SiH_4$ film thickness to 10–20 ML. For thicker film than 20 ML, the product yield decreased because of the less efficient penetration (diffusion) of the H atoms inside the thicker film. The solid product formed at 10 K has the polysilane-like structure. It was found that the three-dimensional Si—Si bond network was developed when the solid product formed at 10 K was further reacted by H atoms at 200 K (chemical annealing). The analyses of the chemically annealed solid product by SE and FT-IR revealed that the solid product was mainly composed of amorphous silicon containing some crystal silicon.

The yield of solid product increased with decrease of temperature down to 10 K. Observed negative temperature dependence of the rate for the formation of solid product is opposite to the temperature dependence for the general chemical reactions which follow the Arrhenius equation. The observed negative temperature dependence may be due either to the increase in the steady state H atom concentration on the film[7,8] and/or to the increase of the rate constants of the tunneling reactions at lower temperature.[8,19,20] The synthesis of better-quality amorphous silicon by the low-temperature tunneling reactions combined with the chemical annealing is possible.

As mentioned above, the present invention provides a semiconductor thin film which is excellent in the uniformity of the film network structure and the film thickness by supplying hydrogen radicals to a thin film on the surface of a substrate which is cooled to 40 K or less to cause tunnel phenomenon.

What is claimed is:

1. A process for forming a semiconductor thin film on the surface of a substrate by supplying said substrate with hydrogen radicals at temperatures of 40 K or less.

2. A process for manufacturing a semiconductor thin film on the surface of a substrate by supplying said substrate with hydrogen radicals while the substrate is cooled to temperature of 40 K or less through heat conduction via a support of said substrate by means of a refrigerator.

3. A process for manufacturing a semiconductor thin film on the surface of a substrate comprising the steps of supporting said substrate having a thin film on its surface; providing an opening for discharging a gas of hydrogen radicals so that it faces to the thin film of said substrate; and supplying said thin film with hydrogen radicals from said gas discharge opening while the substrate is cooled to temperatures below 40 K through heat conduction via said support by means of a refrigerator.

4. A process for manufacturing a semiconductor thin film on the surface of a substrate comprising the steps of supporting said substrate having a thin film on its surface; providing an opening for discharging gas of hydrogen radicals so that it faces to the thin film of said substrate; supplying said thin film with hydrogen radicals from said discharge opening while the substrate is cooled to temperatures below 40 K though heating conduction via said support by means of a refrigerator; and conducting an annealing of the thin film by supplying said thin film with hydrogen radicals from said gas discharge opening while the substrate having said thin film formed thereon is heated to temperatures above room temperature through heating conduction via said support.

5. A process for manufacturing a semiconductor thin film on the surface of a substrate comprising the steps of supporting said substrate having a thin film on its surface; providing an opening for discharging a gas of hydrogen radicals so that it faces to the thin film of said substrate; supplying said thin film with hydrogen radicals from said discharge opening while the substrate is cooled to temperatures below 40 K though heating conduction via said support by means of a refrigerator; and thereafter conducting an annealing of said semiconductor thin film by heating said substrate having the semiconductor film formed thereon through heating conduction via the support while supply of said semiconductor thin film with hydrogen radicals is continued.

6. An apparatus for forming a semiconductor thin film, comprising a vacuum chamber, a refrigerator having a cooling head, which is capable of cooling the head to temperatures below 40 K, hydrogen radical generating means, a support for supporting a substrate which is in contact with said cooling head so that it is cooled, heating means for heating said support to temperatures above room temperature, hydrogen radical generating means for generating hydrogen radicals by exciting a hydrogen-containing gas and a hydrogen radical gas discharge opening which is disposed opposite to said substrate for spraying a hydrogen-containing gas which contains hydrogen radicals generated from said hydrogen radical generating means upon said thin film.

* * * * *